United States Patent
Sikarwar et al.

(10) Patent No.: US 11,442,666 B2
(45) Date of Patent: Sep. 13, 2022

(54) STORAGE SYSTEM AND DUAL-WRITE PROGRAMMING METHOD WITH REVERSE ORDER FOR SECONDARY BLOCK

(71) Applicant: Western Digital Technologies, Inc., San Jose, CA (US)

(72) Inventors: Yogendra Singh Sikarwar, Karnataka (IN); Ankit Naghate, Karnataka (IN); Milind Giradkar, Karnataka (IN); Rakshit Tikoo, Uttar Pradesh (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/182,485

(22) Filed: Feb. 23, 2021

(65) Prior Publication Data
US 2022/0155999 A1 May 19, 2022

Related U.S. Application Data

(60) Provisional application No. 63/114,874, filed on Nov. 17, 2020.

(51) Int. Cl.
| | |
|---|---|
| G06F 3/06 | (2006.01) |
| G11C 16/10 | (2006.01) |
| G11C 11/56 | (2006.01) |
| G11C 16/04 | (2006.01) |

(52) U.S. Cl.
CPC ............ *G06F 3/0659* (2013.01); *G06F 3/064* (2013.01); *G06F 3/0619* (2013.01); *G06F 3/0673* (2013.01); *G11C 11/56* (2013.01); *G11C 16/10* (2013.01); *G11C 16/0483* (2013.01)

(58) Field of Classification Search
CPC combination set(s) only.
See application file for complete search history.

(56) References Cited

U.S. PATENT DOCUMENTS

| | | | |
|---|---|---|---|
| 7,848,144 B2 | 12/2010 | Lasser | |
| 8,310,876 B2 | 11/2012 | Yoo et al. | |
| 8,468,294 B2* | 6/2013 | Huang | G06F 3/0608 |
| | | | 711/E12.008 |
| 9,891,847 B2* | 2/2018 | Ravimohan | G06F 3/065 |
| 9,952,784 B2 | 4/2018 | Sathyanarayan et al. | |
| 10,153,046 B1 | 12/2018 | Agarwal et al. | |
| 2009/0310413 A1* | 12/2009 | Lasser | G11C 16/3427 |
| | | | 365/185.12 |

(Continued)

OTHER PUBLICATIONS

L. Ju et al., "NVM-Based FPGA Block RAM With Adaptive SLC-MLC Conversion," in IEEE Transactions on Computer-Aided Design of Integrated Circuits and Systems, vol. 37, No. 11, pp. 2661-2672, Nov. 2018, doi: 10.1109/TCAD.2018.2857261. (Year: 2018).*

(Continued)

*Primary Examiner* — Daniel C. Chappell
(74) *Attorney, Agent, or Firm* — Crowell & Moring LLP

(57) ABSTRACT

A storage system has a memory with primary and secondary blocks. Data is stored redundantly in the primary and secondary memory blocks but in a different programming order. For example, data is programmed in the first memory block starting at a first wordline and ending at a last wordline, while data is programmed in the second memory block starting at the last wordline and ending at the first wordline.

16 Claims, 9 Drawing Sheets

(56) References Cited

U.S. PATENT DOCUMENTS

| | | | | |
|---|---|---|---|---|
| 2012/0297121 A1* | 11/2012 | Gorobets | ............ | G06F 12/0246 |
| | | | | 711/E12.008 |
| 2012/0297122 A1* | 11/2012 | Gorobets | ................ | G06F 3/068 |
| | | | | 711/E12.008 |
| 2014/0208002 A1* | 7/2014 | Ma | ...................... | G06F 11/2056 |
| | | | | 711/103 |
| 2015/0098271 A1 | 4/2015 | Lasser | | |
| 2016/0180945 A1* | 6/2016 | Ng | ...................... | G11C 15/046 |
| | | | | 365/185.11 |
| 2017/0031612 A1* | 2/2017 | Ravimohan | ............. | G06F 3/065 |
| 2017/0060453 A1* | 3/2017 | Kodera | ................. | G06F 3/0617 |

OTHER PUBLICATIONS

S. Hong and D. Shin, "NAND Flash-Based Disk Cache Using SLC/MLC Combined Flash Memory," 2010 International Workshop on Storage Network Architecture and Parallel I/Os, 2010, pp. 21-30, doi: 10.1109/SNAPI.2010.11. (Year: 2010).*

W. Cheng, Y. Zou, L. Zeng and Y. Wang, "Hercules: Intelligent Coupling of Dual-Mode Flash Memory and Hard Disk Drive," in The Computer Journal, vol. 64, No. 1, pp. 224-235, Nov. 2019, doi: 10.1093/comjnl/bxaa149. (Year: 2019).*

S. Buzaglo and P. H. Siegel, "Row-by-Row Coding Schemes for Inter-Cell Interference in Flash Memory," in IEEE Transactions on Communications, vol. 65, No. 10, pp. 4101-4113, Oct. 2017, doi: 10.1109/TCOMM.2017.2696530. (Year: 2017).*

* cited by examiner

STORAGE SYSTEM AND DUAL-WRITE PROGRAMMING METHOD WITH REVERSE ORDER FOR SECONDARY BLOCK

CROSS-REFERENCE TO RELATED APPLICATION

This application claims the benefit of U.S. provisional patent application No. 63/114,874, filed Nov. 17, 2020, which is hereby incorporated by reference.

BACKGROUND

A memory of a storage system can comprise single-level cells (SLCs) and multi-level cells (MLCs). For example, with quad-level cells (QLCs), data received from a host can be initially stored in SLC blocks, which are later folded into one QLC block. Because there may be errors in one or more wordlines in an SLC block that can cause data loss, data can be stored redundantly over multiple SLC blocks. For example, instead of using four SLC blocks, four pairs of SLC blocks can be used, with each pair having a primary SLC block and a secondary SLC block storing the same data.

DETAILED DESCRIPTION

Figure 1A:
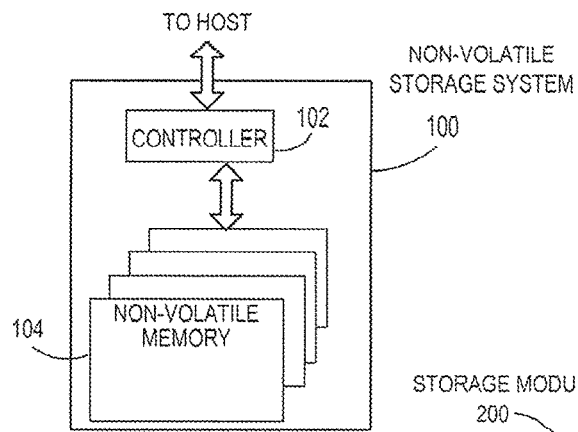
FIG. 1A is a block diagram of a non-volatile storage system of an embodiment.
Figure 1B:
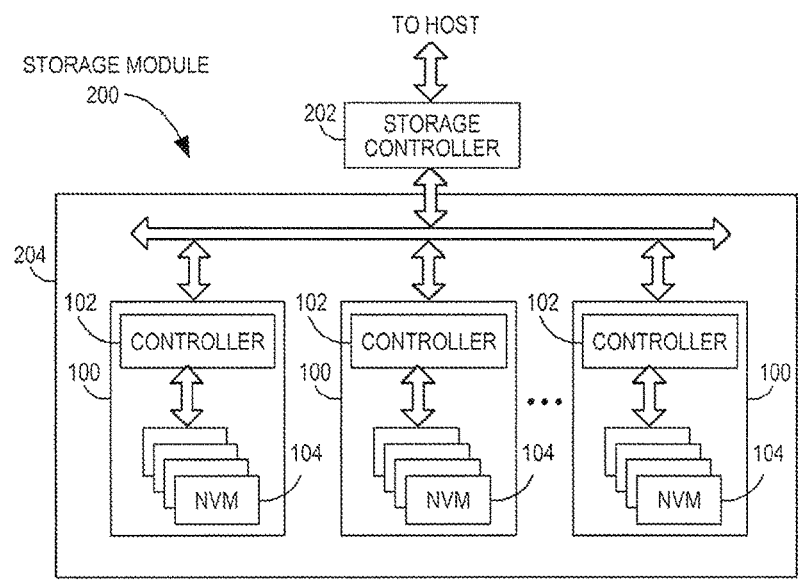
FIG. 1B is a block diagram illustrating a storage module of an embodiment.
Figure 1C:
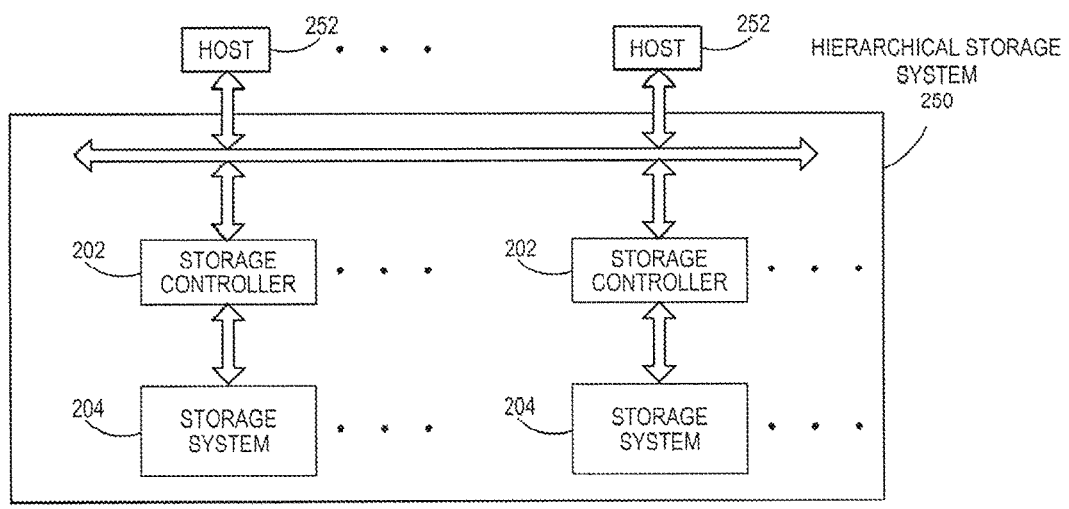
FIG. 1C is a block diagram illustrating a hierarchical storage system of an embodiment.

Turning now to the drawings, storage systems suitable for use in implementing aspects of embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magnetoresistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), quad-level cells (QLC)), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
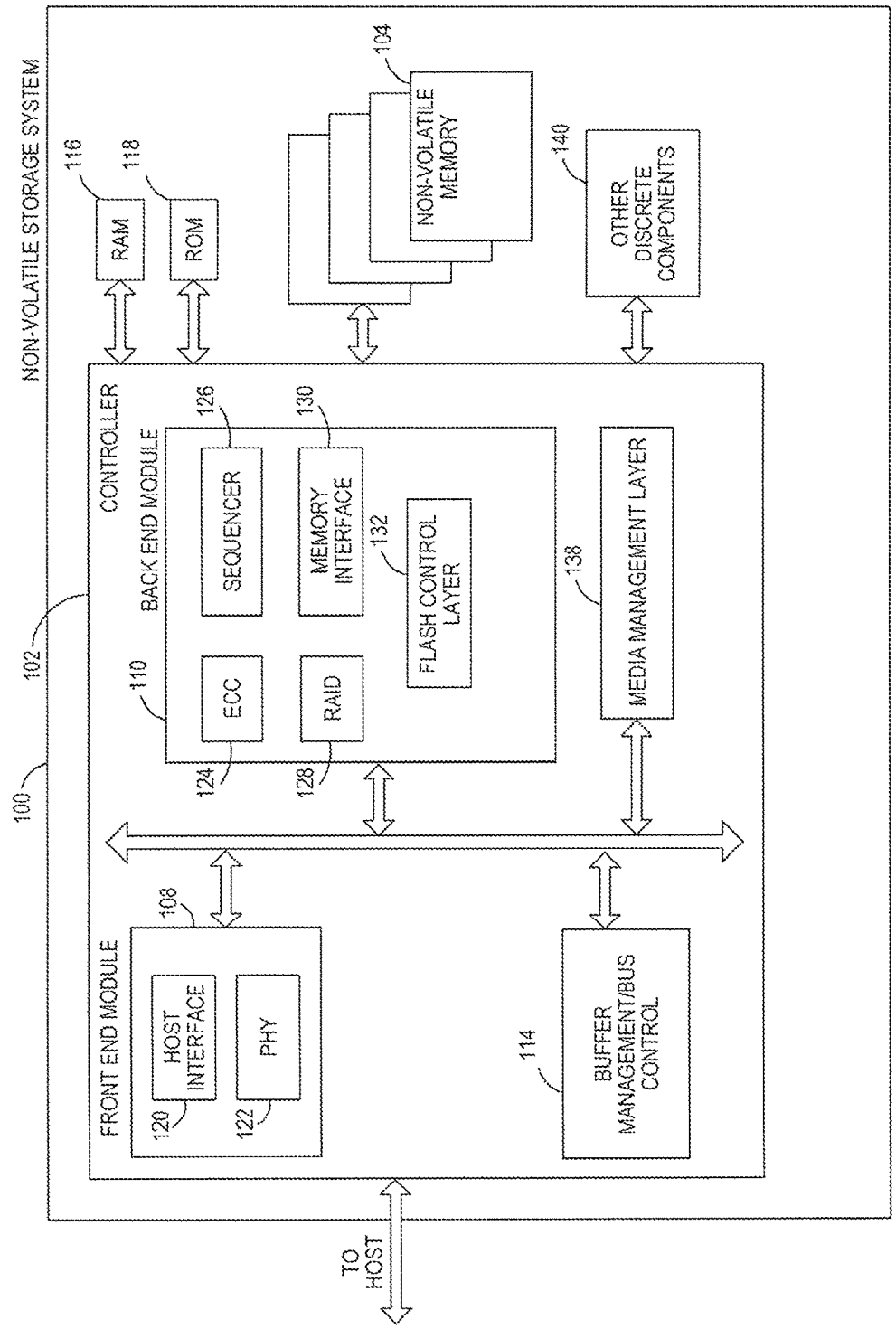
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
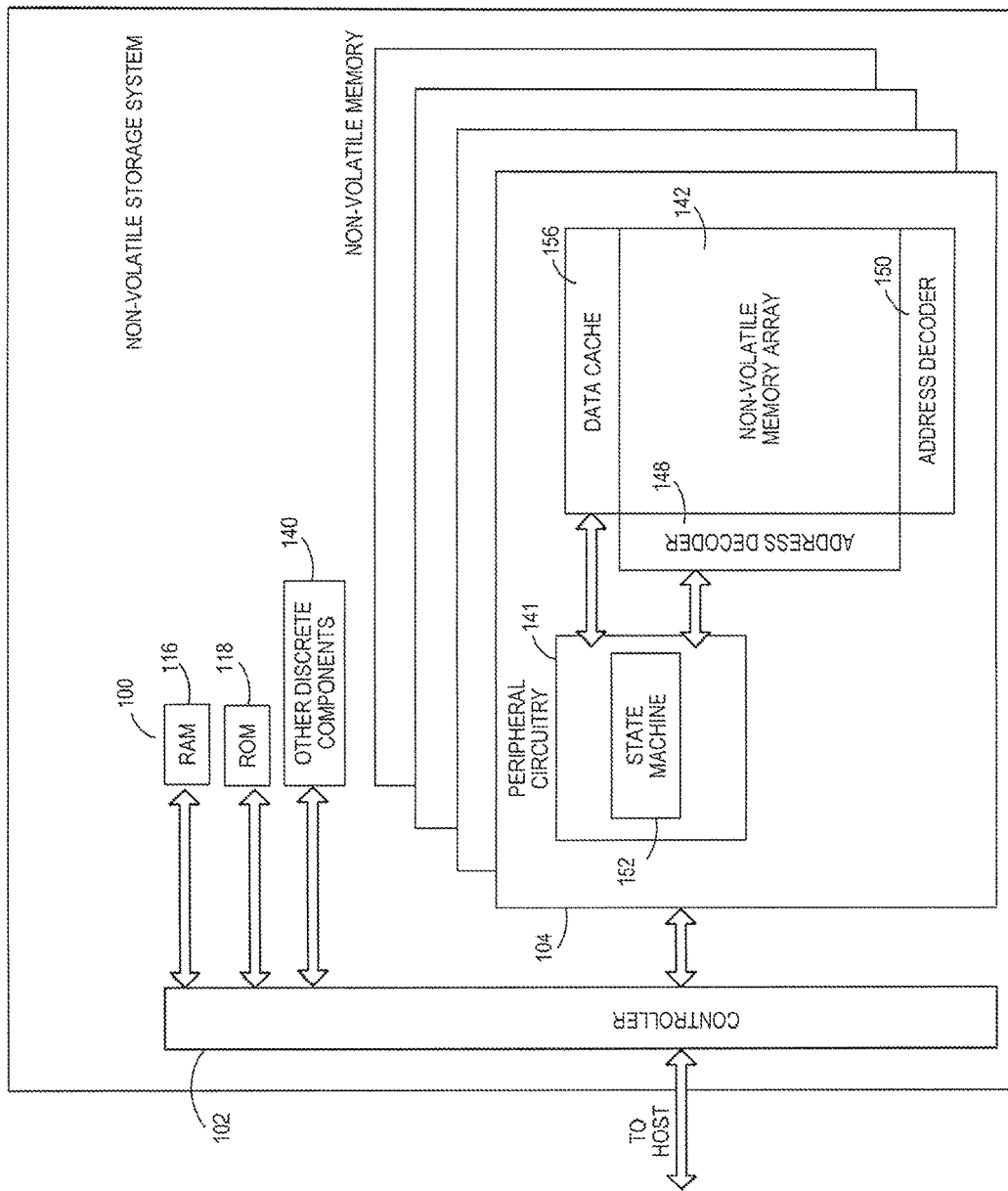
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
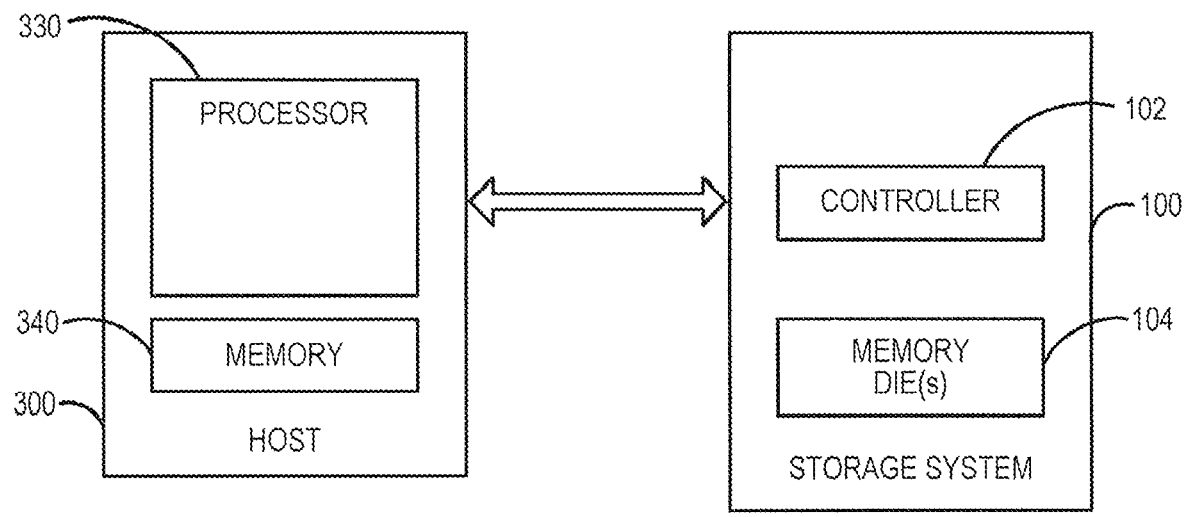
FIG. 3 is a diagram of a host and a storage system of an embodiment.

Turning again to the drawings, FIG. 3 is a block diagram of a host 300 and storage system (sometimes referred to herein as a device) 100 of an embodiment. The host 300 can take any suitable form, including, but not limited to, a computer, a mobile phone, a digital camera, a tablet, a wearable device, a digital video recorder, a surveillance system, etc. The host 300 comprises a processor 330 that is configured to send data (e.g., initially stored in the host's memory 340) to the storage system 100 for storage in the storage system's memory 104.

As mentioned above, the memory 104 in the storage system 100 of this embodiment comprises single-level cells (SLCs) and multi-level cells (MLCs), such as quad-level cells (QLCs). MLCs provide the advantage of storing more bits of data per cell as compared to SLCs. However, it generally takes longer to program MLCs than SLCs. So, to improve performance, the storage system 100 can initially store data (e.g., received from the host 300) in several SLC memory blocks and later transfer ("fold") the data from those blocks to a single QLC memory block. After the data has been successfully written to the QLC block (e.g., after verification using an enhanced post-write read (EPWR) operation), the data can be erased from the source SLC blocks.

Because there may be errors in one or more of the wordlines in an SLC block, the storage system 100 can implement a dual-write programming scheme in which data is redundantly stored in SLC blocks. For example, data received from the host 300 can be stored in a primary SLC block, and the same data can also be stored in a secondary SLC block. This dual-programming scheme can be used with all data or only for certain data that is considered especially important (e.g., boot blocks and control data).

The data can be stored in the secondary SLC block in any suitable manner. For example, in one embodiment, data received from the host 300 can be stored in a volatile memory cache or latches in the storage system 100, then copied from the cache/latches to the primary SLC block as one program operation, and then copied from the cache/latches to the secondary SLC block as a separate program operation. In another embodiment, at least a portion of the primary and secondary SLC blocks can be programmed in parallel.

By storing two copies of the same data (one in the primary SLC block and another in the secondary SLC block), if there is a physical defect in one or more wordlines in the primary SLC block (making the data unreadable), the corresponding data stored in the secondary SLC block can be read instead, thereby avoiding any data loss. However, due to the nature of the memory 104, if an error occurs in one wordline in the primary SLC block, there is a good chance that there will also be an error in the same wordline in the secondary SLC block. Accordingly, it may be desired to avoid storing the same data in the same wordline in the primary and secondary SLC blocks.

Figure 4:
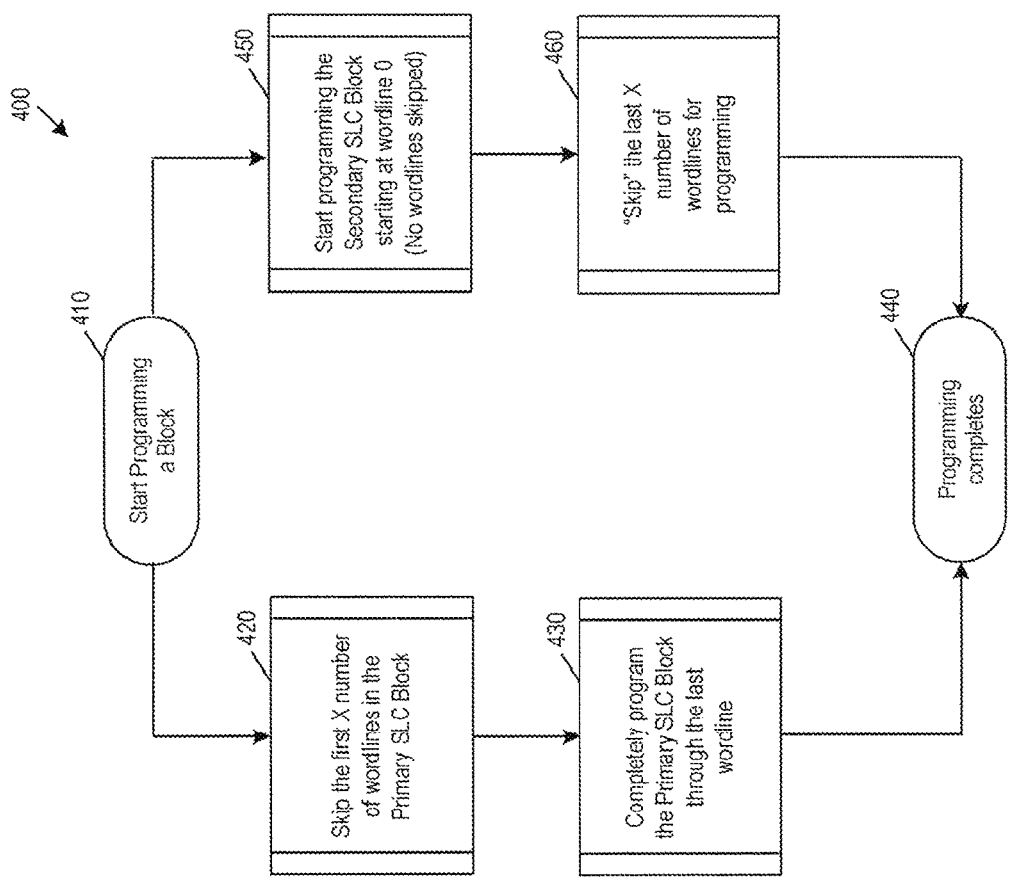
FIG. 4 is a flow chart of a method of an embodiment for skipping different wordlines in primary and secondary memory blocks.

FIG. 4 is a flow chart 400 of a method of an embodiment for doing this. As shown in FIG. 4, when the storage system 100 (e.g., the controller 102 or programing circuitry in the memory die, either of which will be referred to herein as "the controller") starts programming a block in the memory 104, the storage system 100 initiates programming to the primary and secondary SLC blocks (act 410). While FIG. 4 shows two parallel paths in the flow chart 400 for this programming, as noted above, the programming of the primary and secondary SLC blocks can be done in a parallel or serial manner.

Figure 5:
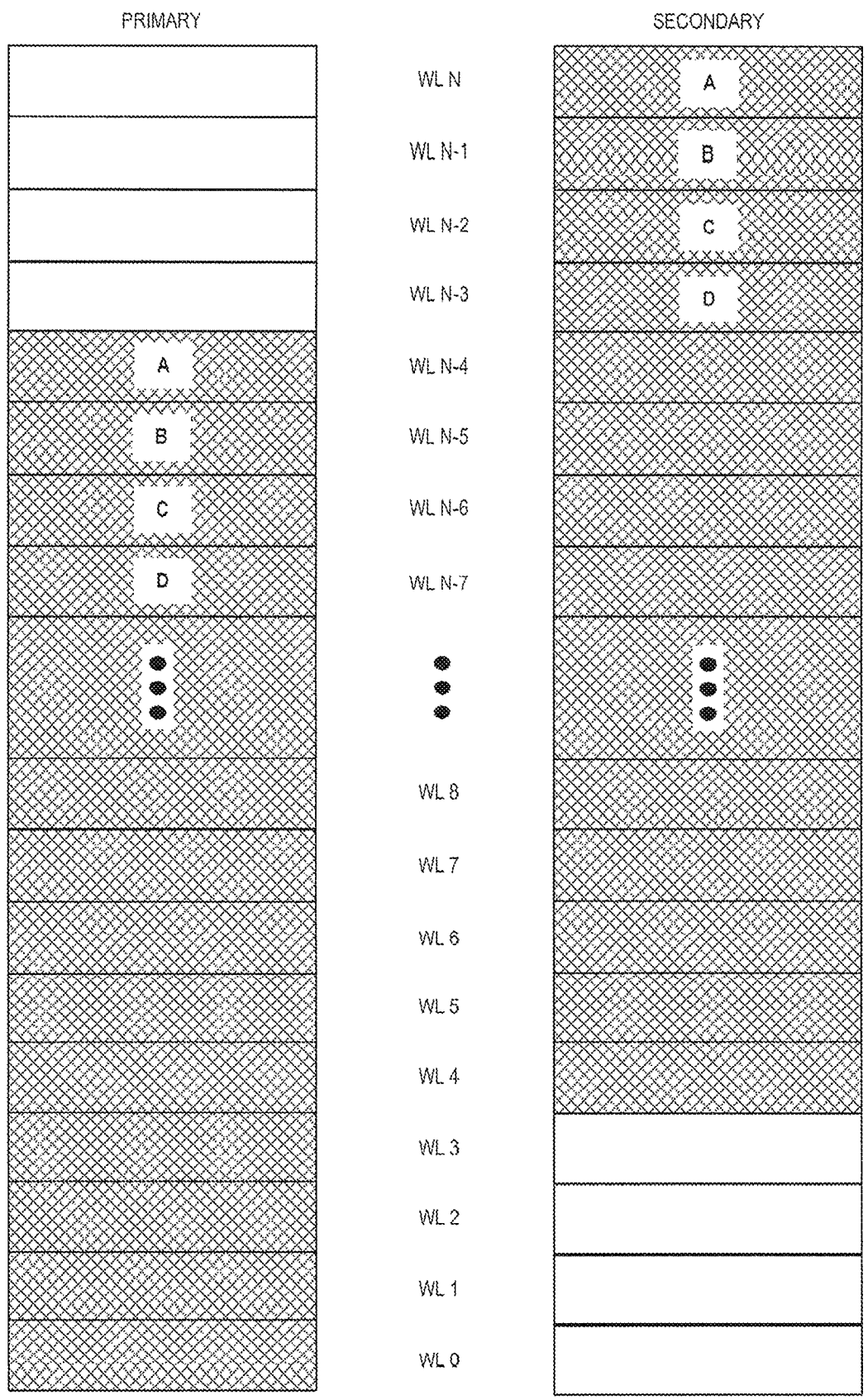
FIG. 5 is an illustration of an embodiment showing skipping different wordlines in primary and secondary memory blocks.

In this embodiment, instead of starting with the first wordline in the primary SLC block for programming, the storage system 100 skips the first X number of wordlines in the primary SLC block (act 420). This is illustrated in the diagram in FIG. 5. As shown in FIG. 5, in this example, the storage system 100 skips the first four wordlines (X=4), so the first wordline that is programmed in the primary SLC block is WL 4. The storage system 100 continues to program the data though the last wordline, here, WL N (act 430). So, out of the N wordlines in the primary SLC block, the first four wordlines are "skipped" from the host data point of view, as they were left erased or were programmed with padded data, resulting in a total of N−4 programmed wordlines in the primary SLC block. It should be noted that while four wordlines were skipped in this example, any other suitable number (e.g., two or eight) of wordlines can be skipped.

As shown in FIG. 5, in programming the secondary SLC block, the first four wordlines are not skipped, as the storage system 100 starts programming the secondary SLC block at WL 0 (i.e., no wordlines are skipped prior to starting programming) (act 450). However, the last four wordlines in the secondary SLC block were not programmed, so, in that sense, the last four wordlines in the secondary SLC block may be considered "skipped." At the conclusion of programming the secondary SLC block, programming is complete (act 440).

As shown in FIG. 5, the result of skipping at least one wordline in one, but not both, SLC blocks is that the written data is staggered. For example, Data A is stored at WL 4 in the primary SLC block and a WL 0 in the secondary SLC block. So, the data in the primary SLC block is "shifted down" by four wordlines as compared to the secondary SLC block. This provides the advantage of data protraction. For example, if there is a memory error in WL 4, that error can result in Data A being unreadable from the primary SLC block. However, Data A can still be read from WL 0 in the secondary SLC block. In contrast, if Data A were stored in WL 4 in both the primary and secondary SLC blocks, Data A may be lost if the memory error that affected WL 4 in the primary SLC block also affected WL 4 in the secondary SLC block.

While this method of staggering data provides protection of the data, it comes at the cost of four unused wordlines in each of the primary and secondary SLC blocks in this example. The following embodiment can be used to achieve the staggered write advantages of the above embodiment while eliminating the disadvantage of unused wordlines. This embodiment is illustrated in FIGS. 6 and 7.

Figure 6:
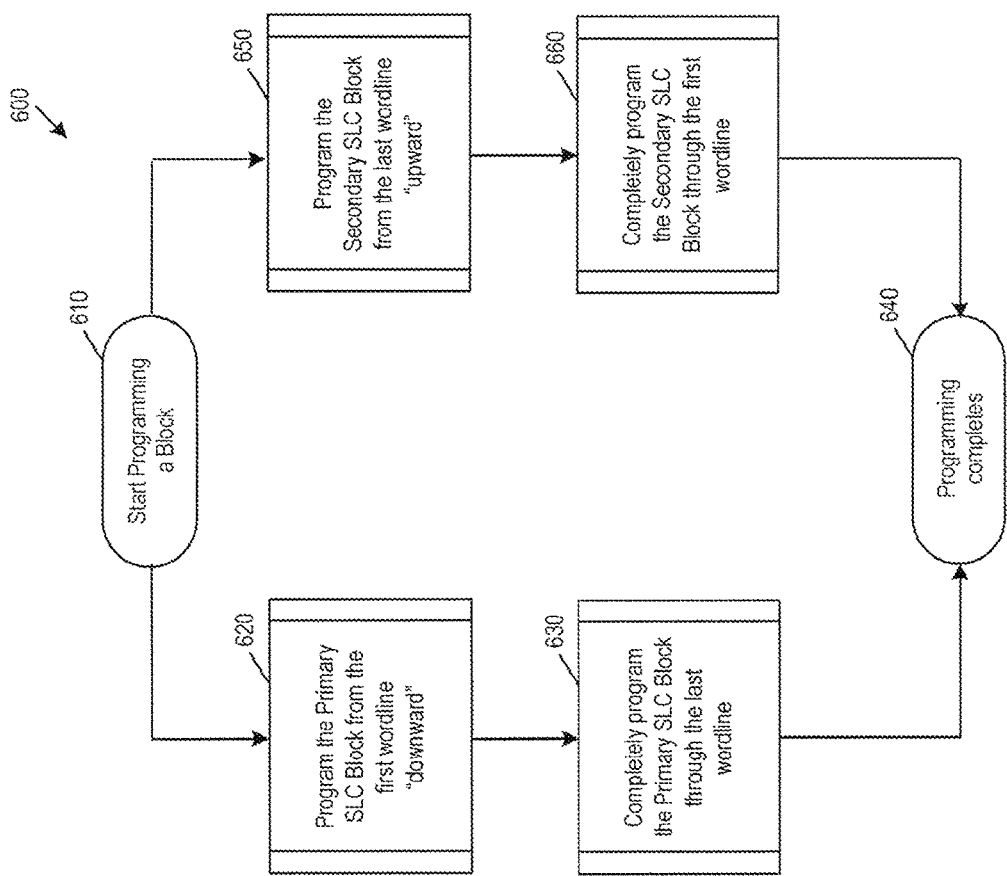
FIG. 6 is a flow chart of a method of an embodiment for improving a dual-write programming scheme by using a reverse programming order in a secondary memory block.

As shown in the flow chart 600 in FIG. 6, in this embodiment, the storage system 100 does not skip any wordlines in the primary SLC block because the storage system 100 starts programming at the first wordline (WL 0) can continues at each subsequent wordline (act 620). So, as shown in FIG. 7, the storage system 100 programs "upward" from the first wordline (WL 0) through the last wordline (WL N) (act 630).

For the secondary SLC block, instead of starting programming at the first wordline (WL 0), the storage system 100 starts programming at the last wordline (WL N) and continues at each subsequent wordline "downward" to the first wordline (acts 650 and 660). So, in the example shown in FIG. 7, the storage system 100 programs WL N, then WL N–1, then WL N–2, etc. until WL 0. At that point, programming is completed (act 640).

Figure 7:
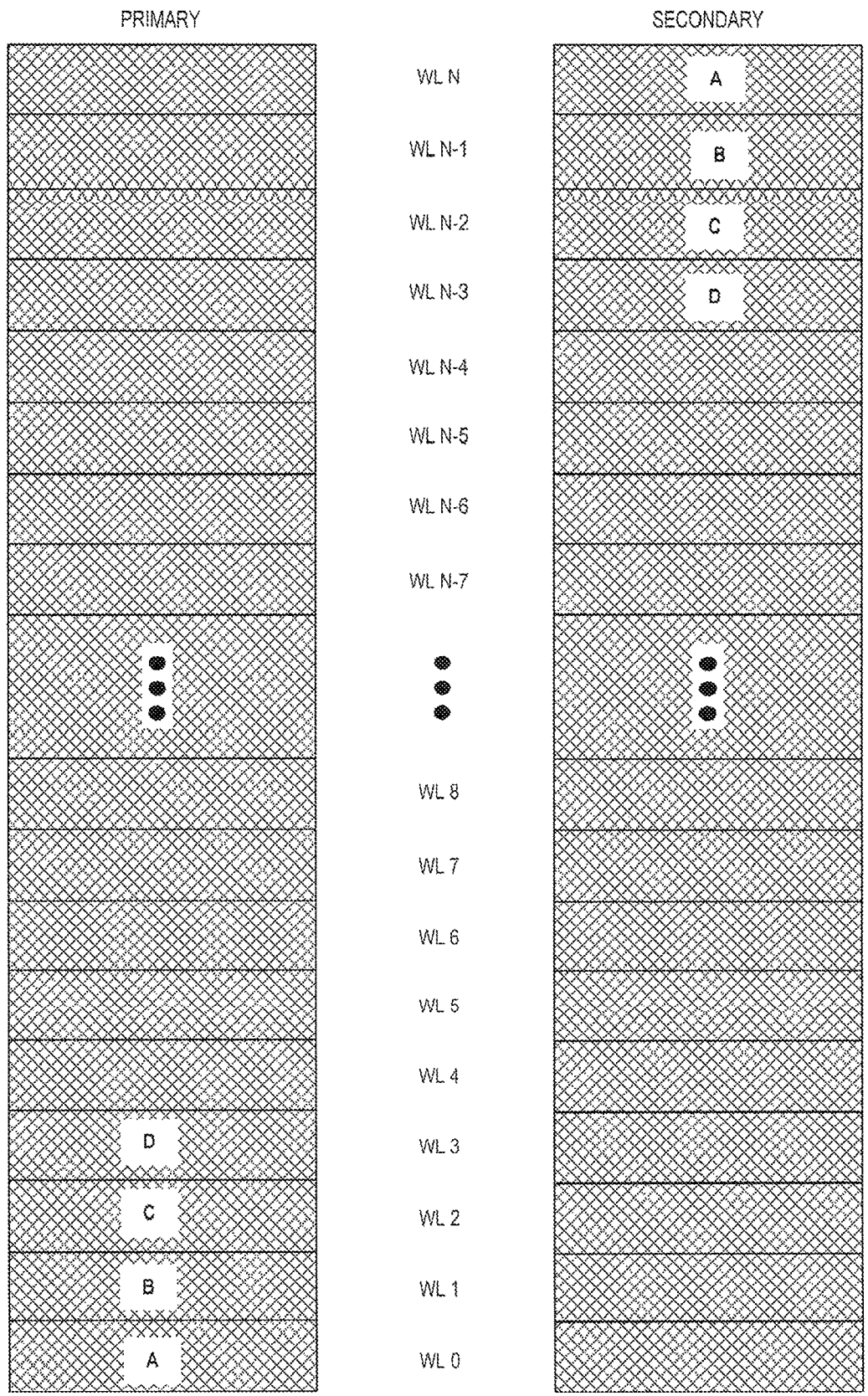
FIG. 7 is an illustration of a dual-write programming operation of an embodiment in which programming in a primary block is in a conventional order and programming in a secondary block is in a reverse order.

As can be seen in FIG. 7, as with the "skipping" method described above, this embodiment provides redundancy for data protection. For example, if WL 0 is defective in both the primary and secondary SLC blocks, this would render Data A in the primary SLC block unreadable, but Data A can still be read from WL N in the secondary SLC block. However, unlike the "skipping" method discussed above, this method of using a reverse programming order between the primary and secondary SLC blocks results in all of the wordlines being programmed with no unprogrammed wordlines in either SLC block. This increases memory utilization. For example, consider the situation in which four SLC blocks are folded into one QLC block. Because of redundancy, eight SLC blocks (four pairs of primary and secondary SLC blocks) would be used. If eight wordlines were skipped in each of the eight SLC blocks, 64 wordlines would go unused. These embodiments can be used to avoid this waste.

Figure 8:
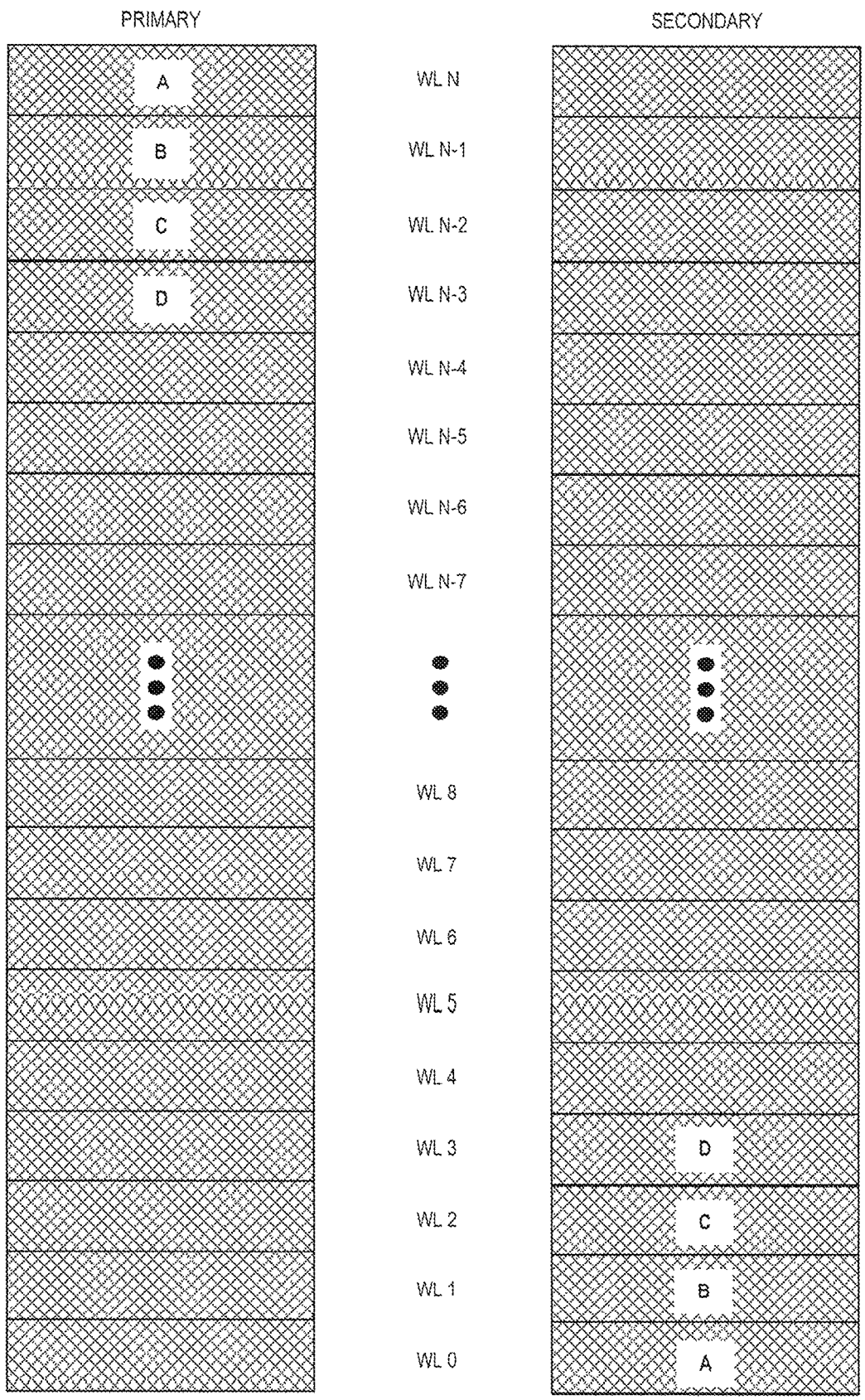
FIG. 8 is an illustration of a dual-write programming operation of an embodiment in which programming in a secondary block is in a conventional order and programming in a primary block is in a reverse order.

There are many alternatives that can be used with these embodiments. For example, in the embodiment shown in FIG. 7, the dual-write programming operation programmed the primary block in a conventional order (WL 0 to WL N) and the secondary block in a reverse order (WL N to WL 0). As shown in FIG. 8, in an alternate embodiment, the dual-write programming operation programs the secondary block in a conventional order and the primary block in a reverse order. Accordingly, in the dual-write programming operation of these embodiments, one of the blocks is programmed in a reverse order with respect to the other block. Either the primary or the secondary block can be programmed in the conventional order, with the other being programmed in the reverse order.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A storage system comprising:
    a memory comprising a multi-level cell (MLC) block of memory, a primary single-level cell (SLC) block of memory, and a secondary SLC block of memory, wherein the primary and secondary SLC blocks of memory comprise a plurality of wordlines; and
    a controller configured to:
        program a plurality of data segments in the plurality of wordlines in the primary SLC block of memory in a first programming order without skipping any wordlines in the prima SLC block, wherein all of the wordlines in the primary SLC block are programmed;
        program a redundant version of the plurality of the data segments in the plurality of wordlines in the secondary SLC block of memory in a second programming order that is opposite the first programming order without skipping any wordlines in the secondary SLC block, wherein all of the wordlines in the secondary SLC block are programmed, and wherein a given data segment and its redundant version are stored in different wordline numbers in the primary and secondary SLC blocks; and
        fold the plurality of data segments into the MLC block of memory, wherein a data segment that is readable from the primary SLC block is read from the primary SLC block, and wherein a data segment that is unreadable from the primary SLC block is read from the secondary SLC block.

2. The storage system of claim 1, wherein the first programming order consecutively programs wordlines starting at a first wordline and ending at a last wordline, and wherein the second programming order consecutively programs wordlines starting at the last wordline and ending at the first wordline, or vice versa.

3. The storage system of claim 1, wherein the controller is further configured to determine whether the data comprises a boot block, and wherein the primary and secondary SLC blocks are programmed with the data in response to determining that the data comprises a boot block.

4. The storage system of claim 1, wherein the controller is further configured to determine whether the data comprises control data, and wherein the primary and secondary SLC blocks are programmed with the data in response to determining that the data comprises control data.

5. The storage system of claim 1, wherein the memory comprises a three-dimensional memory.

6. In a storage system comprising a memory comprising a multi-level cell (MLC) block of memory, a primary single-level cell (SLC) block of memory, and a secondary SLC block of memory, wherein the primary and secondary SLC blocks of memory comprise a plurality of wordlines, a method comprising:
    receiving a plurality of data segments to be stored in the memory;
    performing a dual-write programming operation by:
        storing the plurality of data segments in the primary SLC block of memory starting at a first wordline and ending at a last wordline, without skipping any wordlines in the primary SLC block, wherein all of the wordlines in the primary SLC block are programmed; and
        storing a redundant version of the plurality of data segments in the plurality of wordlines in the secondary SLC block of memory starting at the last wordline and ending at the first wordline without skipping any wordlines in the secondary SLC block, wherein all of the wordlines in the secondary SLC block are programmed, and wherein a given data segment and its redundant version are stored in different wordline numbers in the primary and secondary SLC blocks; and folding the plurality of data segments into the MLC block of memory, wherein a data segment that is readable from the primary SLC block is read from the primary SLC block, and wherein a data segment that is unreadable from the primary SLC block is read from the secondary SLC block.

7. The method of claim 6, wherein the primary and secondary SLC blocks of memory comprise single-level cells.

8. The method of claim 6, further comprising determining whether the data comprises a boot block, and wherein the dual-write programming operation is performed in response to determining that the data comprises a boot block.

9. The method of claim 6, further comprising determining whether the data comprises control data, and wherein the dual-write programming operation is performed in response to determining that the data comprises control data.

10. The method of claim 6, wherein the memory comprises a three-dimensional memory.

11. A storage system comprising:

a memory comprising a multi-level cell (MLC) block of memory, a primary single-level cell (SLC) block of memory, and a secondary SLC block of memory, wherein the primary and secondary SLC blocks of memory comprise a plurality of wordlines;

means for programming a plurality of data segments in the plurality of wordlines in the primary SLC block of memory in a first programming order without skipping any wordlines in the primary SLC block, wherein all of the wordlines in the primary SLC block are programmed;

means for programming a redundant version of the plurality of the data segments in the plurality of wordlines in the secondary SLC block of memory in a second programming order that is opposite the first programming order, without skipping any wordlines in the secondary SLC block, wherein all of the wordlines in the secondary SLC block are programmed, and wherein a given data segment and its redundant version are stored in different wordline numbers in the primary and secondary SLC blocks; and means for folding the plurality of data segments into the MLC block of memory, wherein a data segment that is readable from the primary SLC block is read from the primary SLC block, and wherein a data segment that is unreadable from the primary SLC block is read from the secondary SLC block.

12. The storage system of claim 11, wherein data is programmed in the primary SLC block of memory starting at a first wordline and ending at a last wordline, and wherein data is programmed in the secondary SLC block of memory starting at the last wordline and ending at the first wordline.

13. The storage system of claim 11, further comprising means for determining whether the data should be redundantly programmed.

14. The storage system of claim 11, further comprising means for determining whether the data comprises a boot block, and wherein the primary and secondary SLC blocks are programmed with the data in response to determining that the data comprises a boot block.

15. The storage system of claim 11, further comprising means for determining whether the data comprises control data, and wherein the primary and secondary SLC blocks are programmed with the data in response to determining that the data comprises control data.

16. The storage system of claim 11, wherein the memory comprises a three-dimensional memory.

\* \* \* \* \*